(12) United States Patent
Ma et al.

(10) Patent No.: US 11,443,986 B2
(45) Date of Patent: Sep. 13, 2022

(54) METHOD FOR MAKING SEMICONDUCTOR DEVICE BY ADOPTING STRESS MEMORIZATION TECHNIQUE

(71) Applicant: SHANGHAI HUALI INTEGRATED CIRCUIT CORPORATION, Shanghai (CN)

(72) Inventors: Weiwei Ma, Shanghai (CN); Chao Sun, Shanghai (CN); Wei Lu, Shanghai (CN); Xiaolin Xu, Shanghai (CN); Yamin Cao, Shanghai (CN); Wei Zhou, Shanghai (CN)

(73) Assignee: SHANGHAI HUALI INTEGRATED CIRCUIT CORPORATION, Shanghai (CN)

( * ) Notice: Subject to any disclaimer, the term of this patent is extended or adjusted under 35 U.S.C. 154(b) by 116 days.

(21) Appl. No.: 17/147,984

(22) Filed: Jan. 13, 2021

(65) Prior Publication Data
US 2021/0335672 A1    Oct. 28, 2021

(30) Foreign Application Priority Data
Apr. 26, 2020    (CN) .......................... 202010336966.8

(51) Int. Cl.
*H01L 21/8234* (2006.01)
*H01L 21/02* (2006.01)
*H01L 21/8238* (2006.01)
*H01L 21/78* (2006.01)
*H01L 29/78* (2006.01)

(52) U.S. Cl.
CPC .. *H01L 21/823468* (2013.01); *H01L 21/0223* (2013.01); *H01L 21/02123* (2013.01); *H01L 21/823462* (2013.01); *H01L 21/823807* (2013.01); *H01L 29/7843* (2013.01)

(58) Field of Classification Search
CPC ..... H01L 21/823468; H01L 21/823807; H01L 29/7843; H01L 29/7847; H01L 29/7849
See application file for complete search history.

*Primary Examiner* — John A Bodnar
(74) *Attorney, Agent, or Firm* — Alston & Bird LLP (57) ABSTRACT

The application discloses a method of applying the stress memorization technique in making the semiconductor device which includes: step 1: forming a front gate structure on a silicon wafer having front and back surfaces; step 2: forming sidewalls including a first silicon nitride sidewall, a first silicon nitride layer corresponding to the first silicon nitride sidewall covering a first polysilicon layer on the wafer's back surface; step 3: growing a second silicon nitride layer on the wafer's front surface; step 4: etching the silicon nitride after stress transfer is completed, including: step 41: performing front single-wafer wet etching; step 42: performing batch wet etching to completely remove the second silicon nitride layer and reduces the thickness of the first silicon nitride layer on the back surface; step 5: completing the subsequent process. The application can improve the wafer flatness for improved photolithography for back-end-of-line processes and thereby increasing product yield.

18 Claims, 8 Drawing Sheets

METHOD FOR MAKING SEMICONDUCTOR DEVICE BY ADOPTING STRESS MEMORIZATION TECHNIQUE

CROSS-REFERENCES TO RELATED APPLICATIONS

This application claims priority to Chinese patent application No. CN202010336966.8 filed at CNIPA on Apr. 26, 2020 and entitled "METHOD FOR MAKING SEMICONDUCTOR DEVICE BY ADOPTING STRESS MEMORIZATION TECHNIQUE", the disclosure of which is incorporated herein by reference in entirety.

TECHNICAL FIELD

The application relates to the field of semiconductor integrated circuit manufacturing, in particular, to a method for making a semiconductor device by adopting stress memorization technique.

BACKGROUND

Stress memorization technique applies a tensile stress with a silicon nitride film on a semiconductor device, the stress is then transferred to the channel region of the semiconductor device, so as to form a stress structure in the channel region that is conducive to the increase of electron mobility. Such stress structure in the channel region has a memory effect, that is, the stress will remain after the removal of the stress memorization technique silicon nitride film. With most of the existing methods, the removal process of the stress memorization technique, silicon nitride applies a one-step batch wet etching process, which is characterized by immersing the front surface and the back surface of the semiconductor substrate (i.e. wafer) in hot phosphoric acid at the same time, thus the silicon nitride films are removed from both surfaces at the same time. In addition, to ensure that the silicon nitride film is completely removed from wafer's front surface, over-etching amount in this process is significant, often the silicon nitride film on the wafer's back surface is also fully removed, as a result, the polysilicon film in the polysilicon gate on the back surface of the wafer becomes exposed. What is worse it that the exposed film structure on the back surface of the wafer remains exposed till the back-end-of-line (BEOL) process.

In a wafer foundry, if the front-end-of-line and back-end-of-line processes share the same photolithography equipment, typically a device's connecting metal layer will be formed on the surface of the wafer in the back-end-of-line process. In the back-end-of-line process, the wafer must go through the back surface cleaning process to reduce the metal ion concentration to a safe range before entering the photolithography process. However, the solution for cleaning the wafer's back surface has a high etching speed for the polysilicon film of the exposed polysilicon gate on the wafer's back surface, wherein the etching speed is about 10000 Å/min. Because of the operation mode of the wafer back surface cleaning process, the amount cleaned at the center of the wafer back surface will be more than other areas, resulting in flatness nonuniformity, which causes photolithographic defocus defects, thereby low wafer yield. This problem cannot be eliminated by diluting the solution for cleaning the back surface of the wafer, because of the risk that the concentration of metal ions may exceed the specification.

In addition, the wafer's back surface is in frequent contact with various mechanical stages, such as chucks, and the contact points are easily contaminated. After the wafer's back surface is cleaned, the flatness of the wafer's back surface is even worse from the uneven etching speeds of different areas, for example, the contaminated areas may have lower etching speeds than other areas, further causing photolithographic defocus defects and low yield.

Especially at advanced technology nodes of 28 nm and below, the photolithography's depth of focus (DOF) limitation has become more sensitive than the past to wafer flatness, it is difficult to remedy the photolithographic defocus defects caused by the wafer flatness uniformity. Even if some may be remedied by rework of second photolithographic process, the cost is very high.

The existing method will be described below with reference to the drawings. FIG. 1A to FIG. 1F, which are schematic diagrams of device structures after each step of the method for making the semiconductor device by adopting a stress memorization technique.

Figure 1A:
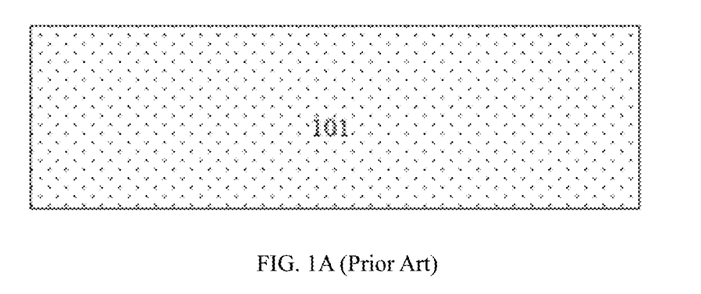
FIG. 1A to FIG. 1F are structural schematic diagrams of a semiconductor device after each existing major step of applying existing stress memorization technique.

The method for manufacturing the semiconductor device by adopting the stress memorization technique includes the following steps:

In step 1, referring to FIG. 1A, a semiconductor substrate 101 is provided. Generally, the semiconductor substrate 101 is a silicon substrate.

Figure 1B:
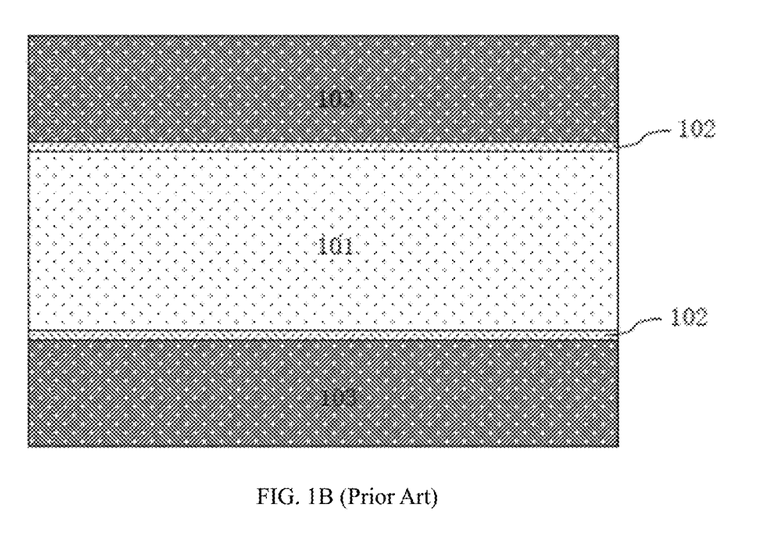

The forming process of a gate structure on the front surface of the semiconductor substrate 101 includes the following steps:

Referring to FIG. 1B, thermal oxidation is performed to the semiconductor substrate 101 to simultaneously form a first oxide layer 102 on both front and back surfaces of the semiconductor substrate 101; a first polysilicon layer 103 is simultaneously formed on the surface of the first oxide layer 102 on the front and back surfaces of the semiconductor substrate 101. Generally, the first polysilicon layer 103 is grown by a thermal process in a furnace.

Figure 1C:
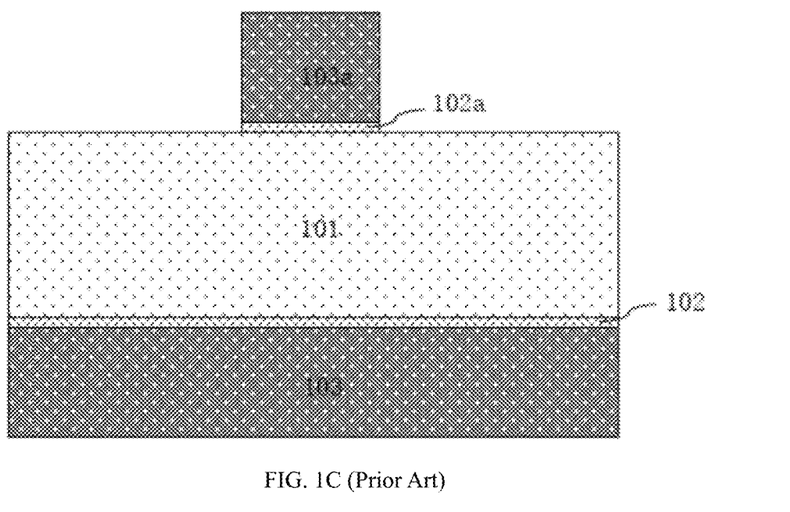

Referring to FIG. 1C, a photolithography process is performed to define the forming area of the gate structure, the first oxide layer 102 and the first polysilicon layer 103 on the front surface of the semiconductor substrate are sequentially etched to form the gate structure by superimposing a gate oxide layer 102a and a polysilicon gate 103a, the gate oxide layer 102a consists of the first oxide layer 102 after etching, and the polysilicon gate 103a consists of the first polysilicon layer 103 after etching.

Figure 1D:
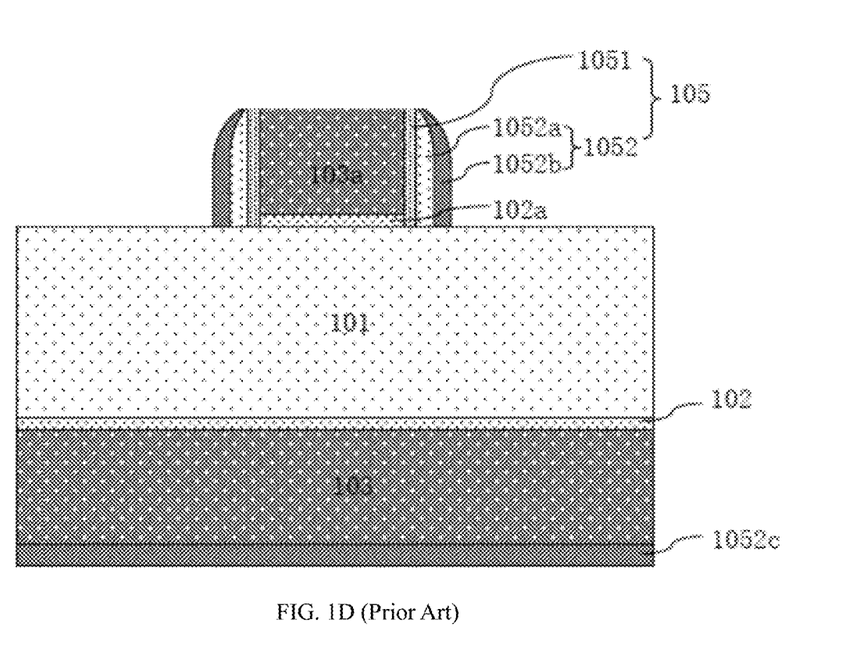

In step 2, referring to FIG. 1D, sidewalls 105 are formed on the side surfaces of the gate structure. The sidewalls include a first silicon nitride sidewall 1052b. These sidewalls are disposed on both sides of the gate structure. For simplicity, only the sidewall at one side of the gate is labeled and described, which applies to those on the other side of the gate.

Typically, the sidewalls 105 include double sidewalls.

After the first sidewall 1051 is completed, performing doping in the drain region of the semiconductor device with light ion implantation to form lightly doped drain region on the two sides of the corresponding gate structure. The material of the first sidewall 1051 may be one of silicon oxide, silicon nitride, and silicon oxynitride.

Then a second sidewall 1052 is formed, the second sidewall 1052 includes a first silicon oxide sidewall 1052a and the first silicon nitride sidewall 1052b; the first silicon oxide sidewall 1052a covers the side surface of the first sidewall 1051, and the first silicon nitride sidewall 1052b covers the side surface of the first silicon oxide sidewall 1052a.

The forming process of the first silicon nitride sidewall 1052b includes the following steps:

A first silicon nitride layer 1052c is simultaneously grown on the front surface and the back surface of the semiconductor substrate 101, the first silicon nitride layer 1052c on the front surface of the semiconductor substrate 101 covers the top surface and the side surfaces of the gate structure and the surface outside the gate structure, and the first silicon nitride layer 1052c on the back surface of the semiconductor substrate 101 is formed on and covers the surface of the first polysilicon layer 103.

Generally, the first silicon nitride layer 1052c is formed by applying a furnace growth process.

Comprehensive dry etching is then performed to the first silicon nitride layer 1052c on the front surface of the semiconductor substrate 101, the first silicon nitride layer 1052c on the front surface of the semiconductor substrate 101 is only located on the side surface of the gate structure and forms the first silicon nitride sidewall 105b after dry etching, and the first silicon nitride layer 1052c on the back surface of the semiconductor substrate 101 is reserved after dry etching.

Figure 1E:
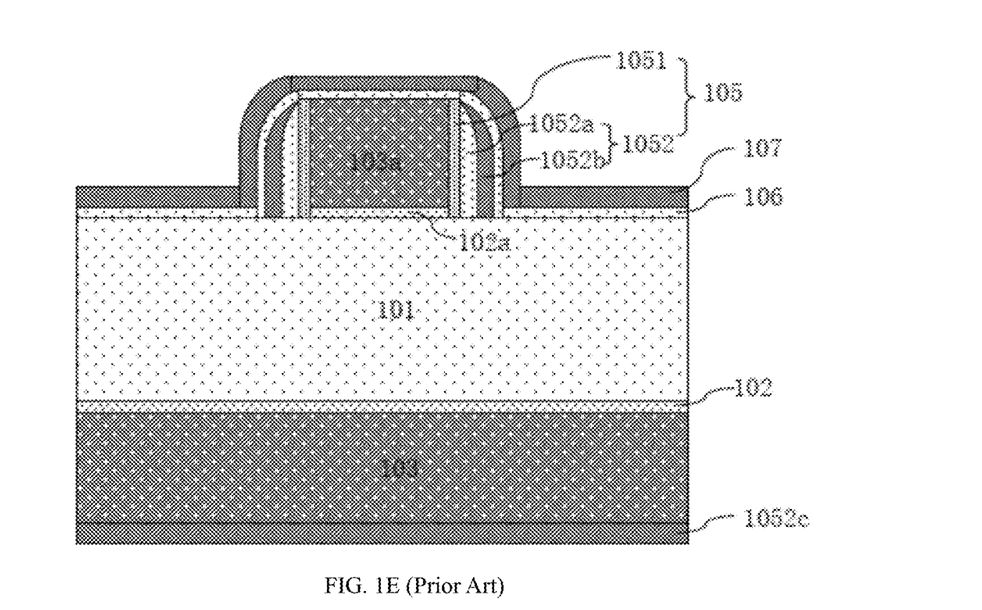

In step 3, referring to FIG. 1E, a second silicon nitride layer 107 with tensile stress for realizing the stress memorization technique is grown on the front surface of the semiconductor substrate 101.

Typically, the second silicon nitride layer 107 is formed by applying a chemical vapor deposition process (CVD) or a plasma enhanced chemical vapor deposition process (PECVD).

According to some embodiments, after the first silicon nitride sidewall 1052b is completed and before the second silicon nitride layer 107 is grown, an amorphous implantation is performed to grow amorphized two sides of the gate structure from the surface structure of the semiconductor substrate 101. The amorphous injection is conducive to the subsequent stress transfer.

In step 4, stress transfer is performed.

Generally, the stress transfer is realized by adopting an annealing process. The annealing process includes a rapid thermal annealing process. Generally, in step 3, before forming the second silicon nitride layer 107, the method further includes the step of forming a second oxide layer 106.

Figure 1F:
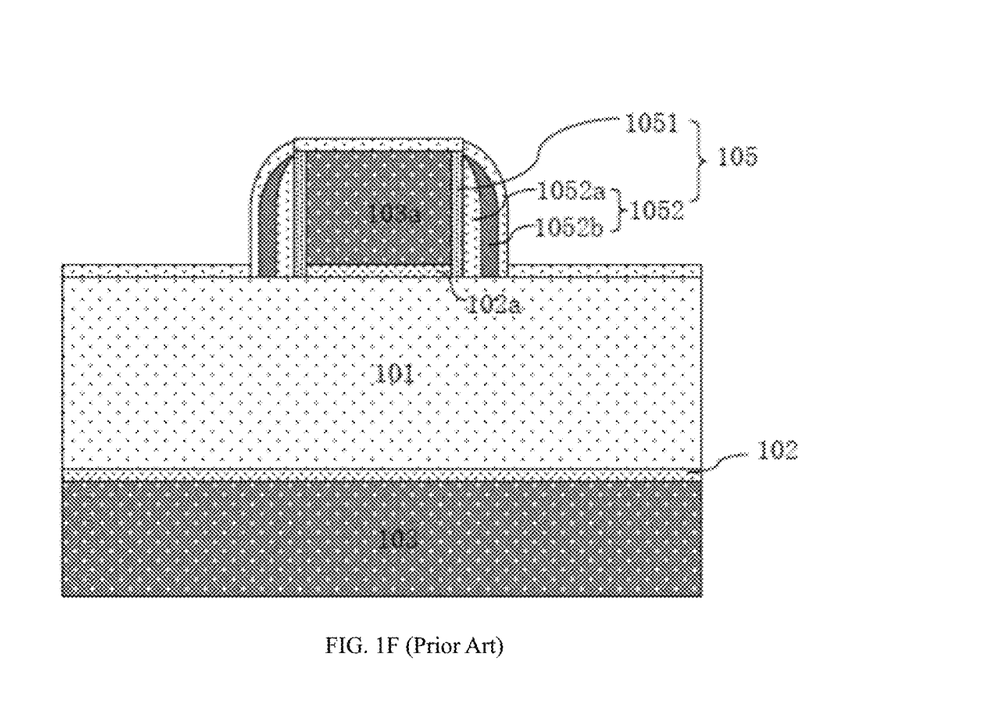

Referring to FIG. 1F, an etching process to remove silicon nitride material is performed after the stress transfer is completed. The etching process is typically implemented by adopting a one-time batch wet etching. To ensure that the second silicon nitride layer 107 on the wafer's front surface is thoroughly removed, the first silicon nitride layer 1052c on the back side is completely removed at the same time. Finally the first polysilicon layer 103 on the back surface is exposed directly to ambient. In the subsequent process, the exposed first polysilicon layer 103 remains on the wafer's back surface during this time.

The first polysilicon layer 103 is eventually etched when the wafer enters the cleaning process before photolithography in the back-end-of-line process. The semiconductor substrate 101 is often a circular wafer, etching speed at the wafer center can be higher than those areas at different radius of the wafer. In addition, the back surface of the semiconductor substrate 101 may be held not flat enough, further worsening the photolithographic defocus defects in the photolithography process and product yield.

BRIEF SUMMARY

The technical problem to be solved by the application is to provide a method of applying the stress memorization technique in making a semiconductor device, which can improve the wafer flatness in back-end-of-line photolithography process and eliminate the photolithographic defocus defects from non-uniformity in back surface of the semiconductor substrate.

According to some embodiments provided by the application, the method for making the semiconductor device by adopting the stress memorization technique includes the following steps:

step 1: providing a semiconductor substrate, and completing a forming process of a gate structure on the front surface of the semiconductor substrate, including: performing thermal oxidation to the semiconductor substrate to simultaneously form a first oxide layer on the front surface and the back surface of the semiconductor substrate; simultaneously forming a first polysilicon layer on the surface of the first oxide layer on the front surface and the back surface of the semiconductor substrate;

performing a photolithography process to define the forming area of the gate structure, and sequentially etching the first oxide layer and the first polysilicon layer on the front surface of the semiconductor substrate to form the gate structure formed by superimposing a gate oxide layer and a polysilicon gate, the gate oxide layer including the first oxide layer after etching, the polysilicon gate including the first polysilicon layer after etching;

step 2: forming sidewalls on the side surface of the gate structure, the sidewalls including a first silicon nitride sidewall and the forming process of the first silicon nitride sidewall includes:

simultaneously growing a first silicon nitride layer on the front surface and the back surface of the semiconductor substrate, the first silicon nitride layer on the front surface of the semiconductor substrate covering the top surface and the side surface of the gate structure and the surface outside the gate structure, and the first silicon nitride layer on the back surface of the semiconductor substrate covering the surface of the first polysilicon layer;

performing comprehensive dry etching to the first silicon nitride layer on the front surface of the semiconductor substrate, the first silicon nitride layer on the front surface of the semiconductor substrate being only located on the side surface of the gate structure and forming the first silicon nitride sidewall after dry etching, the first silicon nitride layer on the back surface of the semiconductor substrate remaining after the dry etching;

step 3: growing a second silicon nitride layer with stress for applying the stress memorization technique on the front surface of the semiconductor substrate;

step 4: performing a silicon nitride material etching process after stress transfer is completed, including the following steps:

step 41: performing first-time wet etching, the first-time wet etching being single-wafer wet etching which removes only the second silicon nitride layer on the front surface of the semiconductor substrate and does not etch the second silicon nitride layer on the back surface;

step 42: performing second-time wet etching, the second-time wet etching being batch wet etching, here the second-time wet etching simultaneously removes the second silicon nitride layer left on the front surface of the semiconductor substrate and the first silicon nitride layer on the back surface, and reduces the thickness of the first silicon nitride layer on the back surface of the semiconductor substrate;

step 5: after step 4, completing subsequent back-end-of-line processes of the semiconductor device, including a number of photolithography processes each follows a cleaning process, during which the first silicon nitride layer remaining on the back surface of the semiconductor substrate protects the first polysilicon layer on the back surface of the semiconductor substrate from being damaged during cleaning, thereby improving the wafer flatness for the photolithography process.

In some cases, the semiconductor substrate includes a silicon substrate.

In some cases, the first polysilicon layer is grown through a thermal process in a furnace.

In some cases, in step 2, the sidewalls include double sidewalls.

After a first sidewall is completed, light implantation is performed to form lightly doped drain regions on the two sides of the corresponding gate structure of the semiconductor device.

Then a second sidewall is formed, and the second sidewall includes a first silicon oxide sidewall and a first silicon nitride sidewall. The first silicon oxide sidewall covers the side surface of the first sidewall, and the first silicon nitride sidewall covers the side surface of the first silicon oxide sidewall.

In some cases, between the first silicon nitride sidewall is formed and the second silicon nitride layer is grown, the method further includes performing amorphous implantation to amorphize the surface structure of the on the two sides of the gate structure of the semiconductor substrate.

In some cases, in step 4, the stress transfer is achieved by an annealing process.

In some cases, the annealing process includes a rapid thermal annealing.

In some cases, the semiconductor device includes an NMOS device and a PMOS device, and in step 4, the stress transfer is performed only in the forming area of the NMOS device.

In some cases, in step 3, before forming the second silicon nitride layer, the method further includes forming a second oxide layer.

In some cases, in the subsequent process of step 5, before the back-end-of-line process, the method further includes the following steps:

performing source and drain implantation to form a source region and a drain region of the semiconductor device in a self-aligned manner on the two sides of the gate structure;

forming self-aligned silicide on the surfaces of the source region and the drain region;

forming and planarizing the interlayer film at a bottom.

In some cases, after forming the interlayer film at the bottom, the method further includes performing a gate structure replacement process, which removes and replaces the polysilicon gate with a metal gate.

In some cases, the back-end-of-line process includes:

forming a plurality of interlayer films, forming a plurality of front metal layers and a number of contact holes, and a via, among the front metal layers, the first front metal layer is in contact with the corresponding source region, the drain region or the metal gate at the lower end through the contact hole, the front metal layers above the first front metal layer are interconnected through the via holes;

wherein the patterned structures of contact holes, via holes and front metal layers are defined through photolithography processes.

In some cases, in step 2, the first silicon nitride layer is formed by a thermal process in a furnace.

In some cases, in step 3, the second silicon nitride layer is formed by a chemical vapor deposition process.

In some cases, the thickness of the first silicon nitride layer is in a range of 200 Å-220 Å; the thickness of the second silicon nitride layer is in a range of 200 Å-280 Å; after the second-time wet etching in step 42 is completed, the thickness of the first silicon nitride layer reserved on the back surface of the semiconductor substrate is in a range of 100 Å-180 Å.

In some cases, etching solution for the first-time wet etching in step 41 is a hot phosphoric acid solution, the temperature is in a range of 140° C.-160° C., and the time is in a range of 200 s-300 s.

In some cases, etching solution for the second-time wet etching in step 42 is hot phosphoric acid solution, the temperature is in a range of 140° C.-170° C., and the time is in a range of 60 s-100 s.

In some cases, the technology node of the semiconductor device is less than 28 nm.

In the application, by combining the forming process of the sidewall silicon nitride layer, i.e., the first silicon nitride layer before the step of forming the stress memorization silicon nitride layer, i.e., the second silicon nitride layer with stress for realizing the stress memorization technique, after the stress transfer, the etching process for removing the silicon nitride material is thoughtfully configured, the etching process of the silicon nitride material is no longer the one-time batch wet etching which aggressively removes the second silicon nitride layer on the front surface at one time, but protects the first silicon nitride layer on the back surface at the same time. First the first-time wet etching is changed by adopting the front single-wafer wet etching process, in this process although the second silicon nitride layer cannot be completely removed by the first-time wet etching, most of the thickness of the second silicon nitride layer can be removed; then the second-time wet etching is realized by adopting a batch wet etching process, the second-time wet etching can completely remove the second silicon nitride layer and simultaneously reserve part of the thickness of the first silicon nitride layer on the back surface of the semiconductor substrate. In this way, the first silicon nitride layer can very well protect the first polysilicon layer on the back surface of the semiconductor substrate in the cleaning process before the photolithography process of the subsequent back-end-of-line process, i.e., the back-end-of-line photolithography process, can prevent the cleaning process from unevenly etching the first polysilicon layer, can enable the surface thickness of the back surface of the semiconductor substrate to be uniform, can improve the wafer flatness during the back-end-of-line photolithography process, and can eliminate the photolithographic defocus defects caused by non-uniformity in wafer flatness. As a result, the product yield is increased.

BRIEF DESCRIPTION OF THE DRAWINGS

The application will be further described below in detail in combination with the specific embodiments with reference to the drawings.

DETAILED DESCRIPTION OF THE DISCLOSURE

Figure 2:
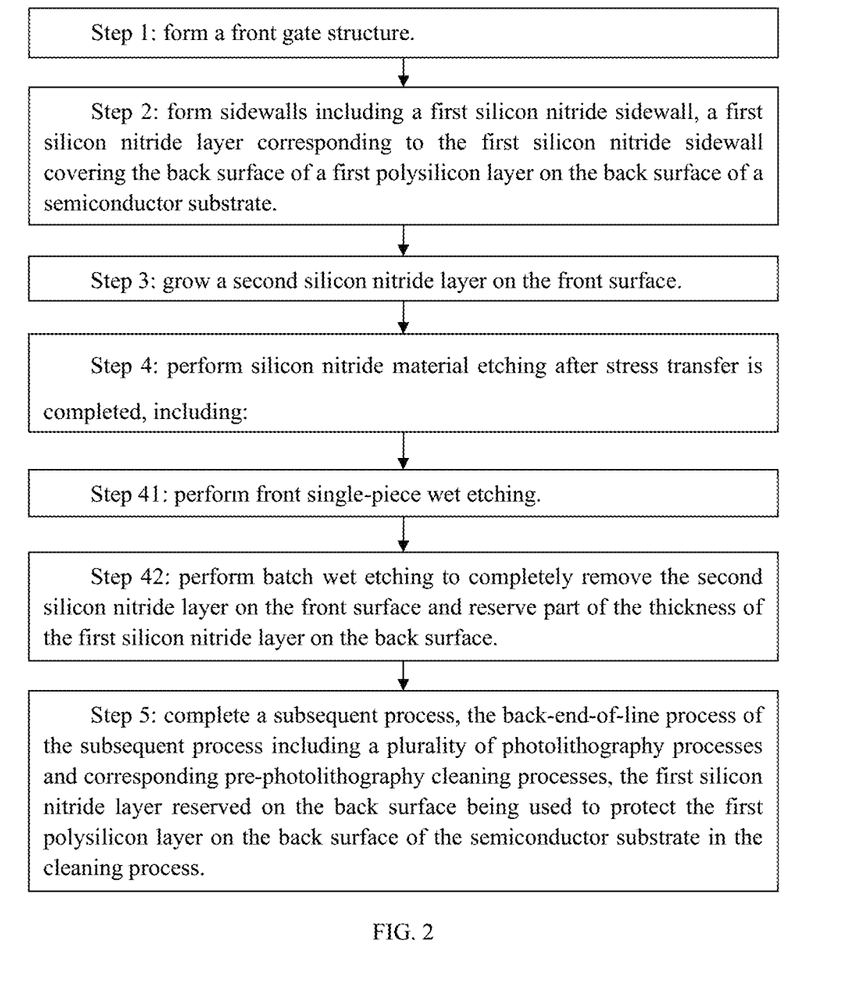
FIG. 2 is a flowchart of a stress memorization technique method for making a semiconductor device according to one embodiment of the application.
Figure 3A:
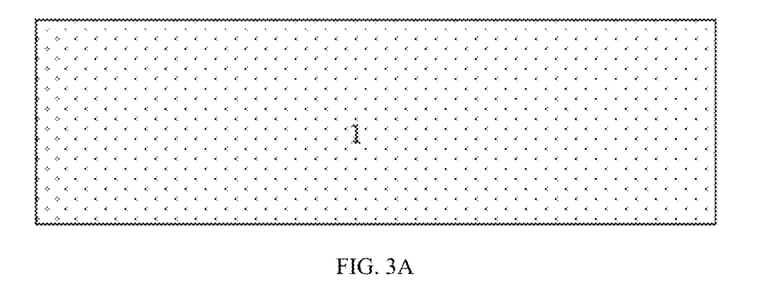
FIGS. 3A to 3G are schematic cross sectional views of the semiconductor device structure after each major step in applying the stress memorization technique method according to one embodiment of the application.

FIG. 2 is a flowchart of a stress memorization technique method for making a semiconductor device according to one embodiment of the application. FIGS. 3A to 3G are schematic cross sectional views of the semiconductor device structure after each major step in applying the stress memorization technique method, according to one embodiment of the application. The stress memorization technique method for making the semiconductor device includes the following steps:

In step 1, referring to FIG. 3A, a semiconductor substrate 1 is provided. In one embodiment, the semiconductor substrate 1 is a silicon substrate.

Figure 3B:
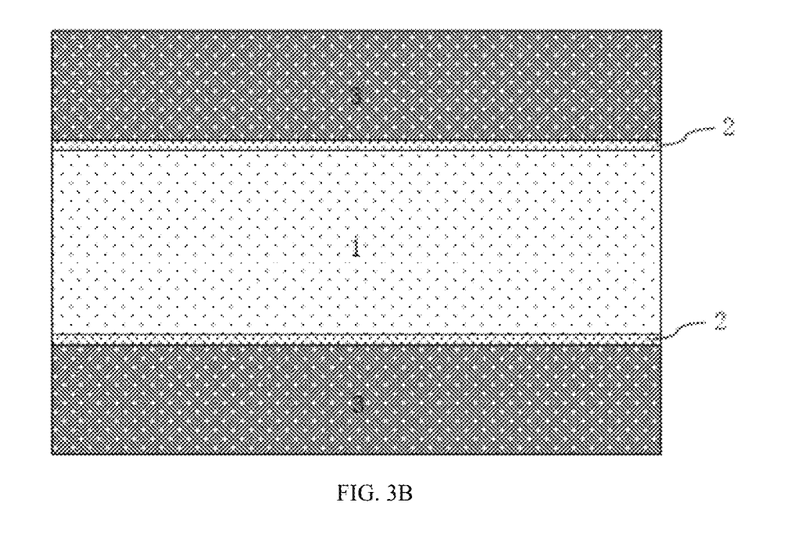

A forming process of a gate structure on the front surface of the semiconductor substrate 1 is completed and includes the following steps:

Referring to FIG. 3B, thermal oxidation is performed to the semiconductor substrate 1 to simultaneously form a first oxide layer 2 on the front surface and the back surface of the semiconductor substrate 1. Two first polysilicon layers are simultaneously formed on the surface of the first oxide layer 2 on the front surface and the back surface of the semiconductor substrate 1. In the embodiment of the application, the first polysilicon layer 3 is grown by adopting a thermal process in a furnace.

Figure 3C:
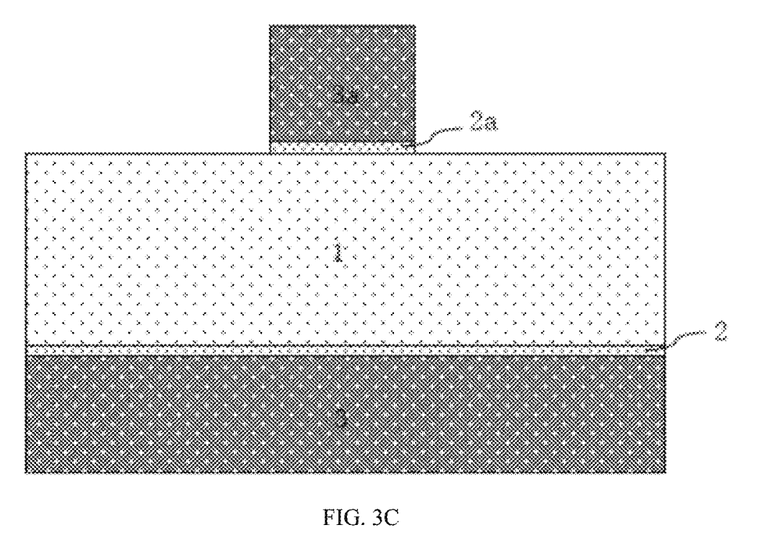

Referring to FIG. 3C, a photolithography process is performed to define the forming area of the gate structure. The first oxide layer and the first polysilicon layer on the front surface of the semiconductor substrate 1 are sequentially etched to form the gate structure by superimposing a gate oxide layer 2a and a polysilicon gate 3a on the front surface of the substrate 1. The gate oxide layer 2a comprises the first oxide layer 2 after etching, and the polysilicon gate 3a comprises the first polysilicon layer 3 after etching.

Figure 3D:
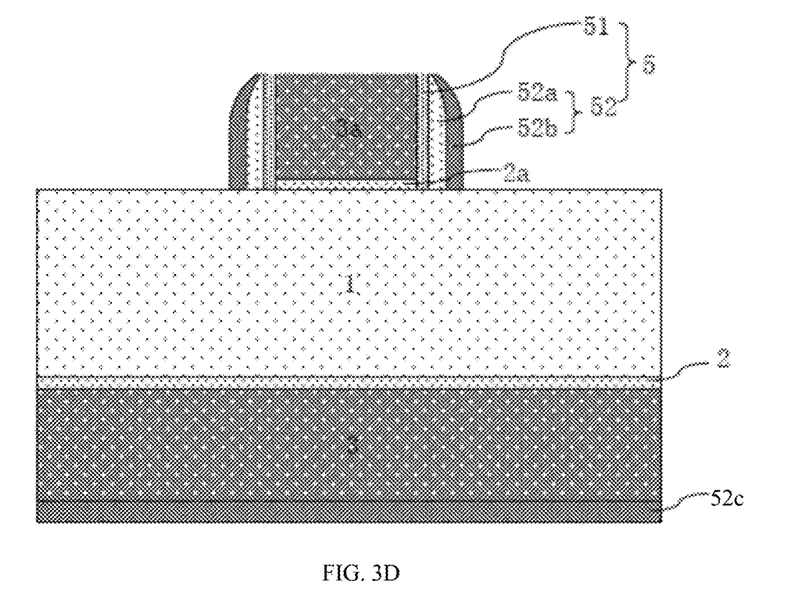

In step 2, referring to FIG. 3D, sidewalls 5 are formed on the side surfaces of the gate structure. The sidewalls 5 include a first silicon nitride sidewall 52b. These sidewalls are disposed on both sides of the gate structure. For simplicity, only the sidewall at one side of the gate is labeled and described, which applies to those on the other side of the gate.

In one embodiment of the application, the sidewalls 5 include double sidewalls.

After a first sidewall 51 is completed, light doping implantation in the drain of the semiconductor device is performed and a lightly doped drain region is formed on the two sides of the corresponding gate structure. The first sidewall 51 includes a silicon oxide sidewall, a silicon nitride sidewall or a silicon oxynitride sidewall.

Then a second sidewall 52 is formed, and the second sidewall 52 includes a first silicon oxide sidewall 52a and the first silicon nitride sidewall 52b; the first silicon oxide sidewall 52a covers the side surface of the first sidewall 51, and the first silicon nitride sidewall 52b covers the side surface of the first silicon oxide sidewall 52a.

The forming process of the first silicon nitride sidewall 52b includes the following steps:

A first silicon nitride layer 52C is simultaneously grown on the front surface and the back surface of the semiconductor substrate 1, the first silicon nitride layer 52C on the front surface of the semiconductor substrate 1 covers the top surface and the side surface of the gate structure and the surface outside the gate structure, the first silicon nitride layer 52C on the back surface of the semiconductor substrate 1 is formed on and covers the surface of the first polysilicon layer 3.

In one embodiment of the application, the first silicon nitride layer 52C is formed by adopting a thermal process in a furnace.

Comprehensive dry etching is performed to the first silicon nitride layer 52C on the front surface of the semiconductor substrate 1, the first silicon nitride layer 52C on the front surface of the semiconductor substrate 1 is only located on the side surface of the gate structure and forms the first silicon nitride sidewall 52b after dry etching, the first silicon nitride layer 52C on the back surface of the semiconductor substrate 1 is reserved after dry etching.

Figure 3E:
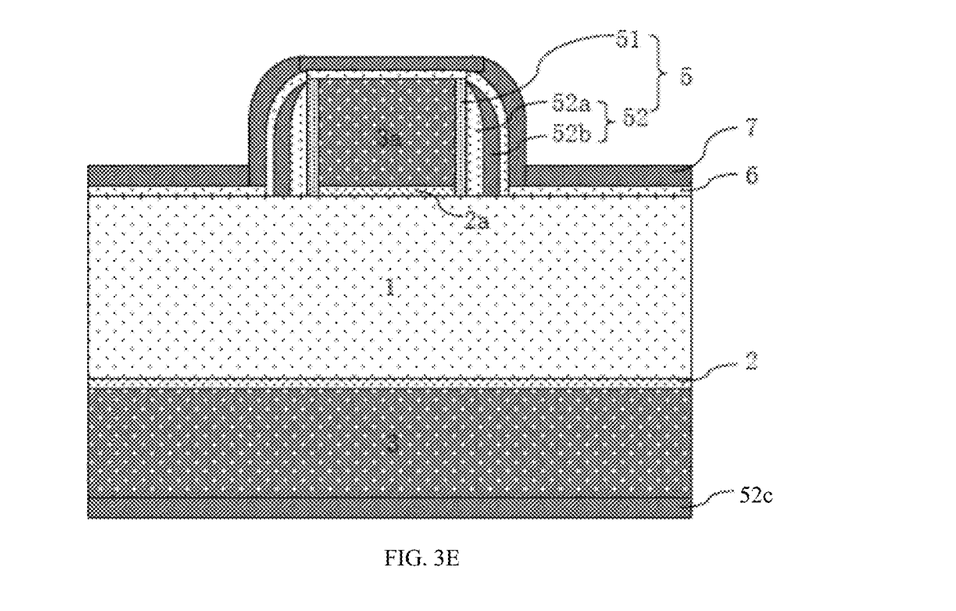

In step 3, referring to FIG. 3E, a second silicon nitride layer 7 is formed on the front surface of the semiconductor substrate, the silicon nitride layer 7 applies the stress memorization technique with a tensile stress.

In one embodiment of the application, the second silicon nitride layer 7 is formed by adopting a chemical vapor deposition process or a plasma enhanced chemical vapor deposition process.

According to some embodiments, after the first silicon nitride sidewall 52b is completed and before the second silicon nitride layer 7 is grown, the method further includes performing amorphous implantation to enable the surface structure of the semiconductor substrate 1 on the two sides of the gate structure to be amorphized. The amorphous implantation is conducive to the subsequent stress transfer.

In step 4, stress transfer is performed.

In one embodiment of the application, the stress transfer is realized by adopting an annealing process. The annealing process includes a rapid thermal annealing process. In step 3, before forming the second silicon nitride layer 7, the method further includes the step of forming a second oxide layer 6.

Figure 3F:
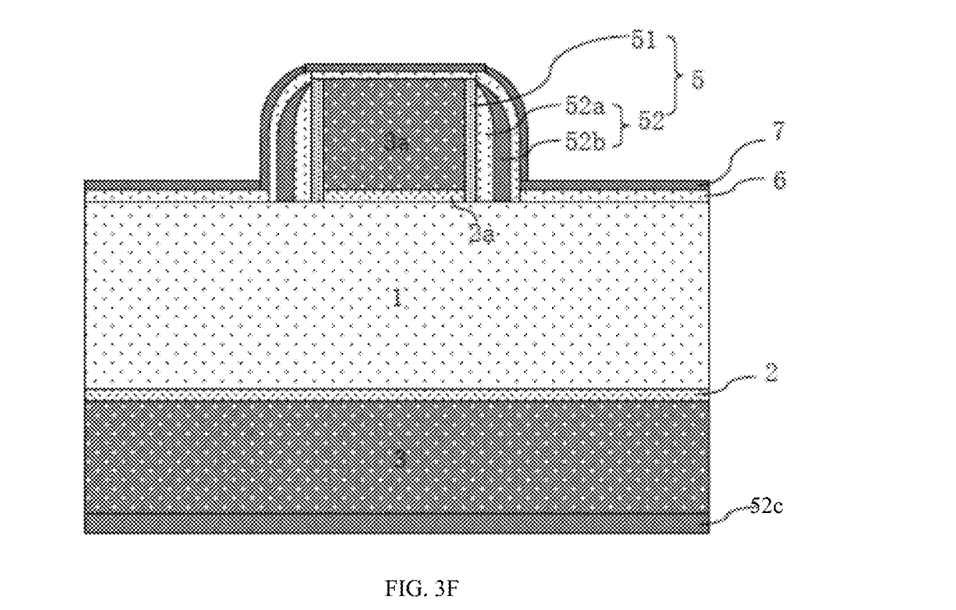

A silicon nitride material etching process is performed after stress transfer is completed, and includes the following sub-steps:

In step 41, referring to FIG. 3F, first-time wet etching is performed. The first-time wet etching is a single-wafer wet etching process and is only used for etching the second silicon nitride layer 7 on the front surface of the semiconductor substrate 1.

Figure 3G:
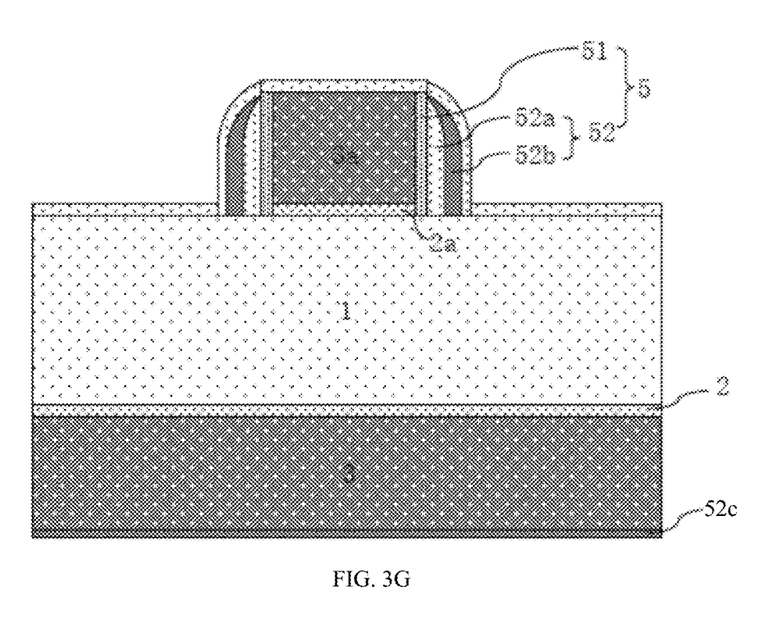

In step 42, referring to FIG. 3G, second-time wet etching is performed. The second-time wet etching is batch wet etching, the second-time wet etching is used for simultaneously etching the second silicon nitride layer 7 left on the front surface of the semiconductor substrate 1 and the first silicon nitride layer 52c on the back surface. The second silicon nitride layer 7 on the front surface of the semiconductor substrate 1 is completely removed after the second-time wet etching, and part of the thickness of the first silicon nitride layer 52c on the back surface of the semiconductor substrate 1 is reserved.

In step 5, a subsequent process after step 4 is performed. The subsequent process includes the back-end-of-line process of the semiconductor device. The back-end-of-line process includes a plurality of photolithography processes and includes a cleaning process before each photolithography process of the back-end-of-line process. The first silicon nitride layer 52c remained on the back surface of the semiconductor substrate 1 is used for protecting the first polysilicon layer 3 on the back surface of the semiconductor substrate 1 in the cleaning process to improve the flatness of the photolithography process.

In one embodiment of the application, in the subsequent process of step 5, before the back-end-of-line process, the method further includes the following steps:

Source and drain implantation is performed to form a source region and a drain region on the two sides of the gate structure of the semiconductor device in a self-aligned manner.

Self-aligned silicide is formed on the surfaces of the source region and the drain region.

The interlayer film is formed at the bottom and planarized.

According to one embodiment, the technology node of the semiconductor device is 28 nm or less. A metal gate has been applied in the technology node less than 28 nm. Therefore, after the interlayer film at the bottom is formed, the method further includes a gate structure replacement process. The gate structure replacement process removes and replaces the polysilicon gate 3a with a metal gate.

The back-end-of-line process includes the following step:

A forming process for forming a plurality of interlayer films, a plurality of front metal layers, a contact and a via is performed. The first front metal layer is in contact with the corresponding source region, the drain region or the metal gate at the bottom through the contact. The front metal layers above the first front metal layer are connected through the via.

The patterned structures of the contact holes, the via holes and the front metal layers are defined through photolithography processes.

The method according to the embodiment of the application will be further described below in combination with exemplary parameters. In the method according to the embodiment of the application, the following parameters may be examples:

The thickness of the first silicon nitride layer 52c is in the range of 200 Å-220 Å; the thickness of the second silicon nitride layer 7 is in the range of 200 Å-280 Å; after the second-time wet etching in step 42, the thickness of the first silicon nitride layer 52c left on the back surface of the semiconductor substrate 1 is in the range of 100 Å-180 Å.

The etching solution for the first-time wet etching in step 41 is hot phosphoric acid solution, the temperature is in the range of 140° C.-160° C., and the time is in the range of 200 s-300 s.

The etching solution for the second-time wet etching in step 42 is hot phosphoric acid solution, the temperature is in the range of 140° C.-170° C., and the time is in the range of 60 s-100 s.

In the embodiment of the application, by combining the forming process of the first silicon nitride layer 52c before the step of forming the second silicon nitride layer 7, after the stress transfer, the etching process for removing the silicon nitride material is specially configured, the etching process of the silicon nitride material is no longer the one-time batch wet etching which completely removes the second silicon nitride layer 7 on the front surface at one time but considers the first silicon nitride layer 52c on the back surface, firstly the first-time wet etching is realized by adopting the front single-piece wet etching process, and although the second silicon nitride layer 7 cannot be completely removed by the first-time wet etching, most of the thickness of the second silicon nitride layer 7 can be removed; then the second-time wet etching is realized by adopting a batch wet etching process, the second-time wet etching can completely remove the second silicon nitride layer 7 and simultaneously reserve part of the thickness of the first silicon nitride layer 52c on the back surface of the semiconductor substrate 1. In this way, the first silicon nitride layer 52c can very well protect the first polysilicon layer 3 on the back surface of the semiconductor substrate 1 in the cleaning process before the photolithography process of the subsequent back-end-of-line process, i.e., the back-end-of-line photolithography process, can prevent the cleaning process from unevenly etching the first polysilicon layer 3, can enable the surface thickness of the back surface of the semiconductor substrate 1 to be even, can improve the wafer flatness of the back-end-of-line photolithography process, can eliminate the photolithographic defocus defects caused by the flatness non-uniformity of the back surface of the semiconductor substrate 1, and finally can improve the product yield.

The exemplary embodiments of the present disclosure are specifically shown and described above in detail through the specific embodiments. It should be understood that the present disclosure is not limited to the detailed structure, arrangement or implementation method described herein; on the contrary, the present disclosure intends to cover various modifications and equivalent arrangements included in the spirit and scope of the appended claims. Without departing from the principle of the application, those skilled in the art may also make many variations and improvements, which should also be regarded as included in the protection scope of the application.

What is claimed is:

1. A method of applying a stress memorization technique in making a semiconductor device, comprising a plurality of steps:

step 1: providing a semiconductor substrate, having a front surface and a back surface; forming a gate structure on the front surface, wherein the forming the gate structure on the front surface comprises:
performing thermal oxidation to the semiconductor substrate to simultaneously form a first oxide layer on the front surface and the back surface of the semiconductor substrate; simultaneously forming a first polysilicon layer on a surface of the first oxide layer on the front surface and the back surface of the semiconductor substrate;
performing a photolithography process to define an area of the gate structure, and sequentially etching the first oxide layer and the first polysilicon layer on the front surface of the semiconductor substrate to form the gate structure by superimposing a gate oxide layer and a polysilicon gate, wherein the gate oxide layer includes the first oxide layer after etching, and wherein the polysilicon gate includes the first polysilicon layer after etching;

step 2: forming sidewalls on a side surface of the gate structure, wherein the sidewalls comprises a first silicon nitride sidewall, wherein a process of forming the first silicon nitride sidewall comprises:
growing a first silicon nitride layer on each of the front surface and the back surface of the semiconductor substrate simultaneously, wherein the first silicon nitride layer on the front surface of the semiconductor substrate is formed to cover a top surface, the side surface of the gate structure and a surface outside the gate structure, and wherein the first silicon nitride layer on the back surface of the semiconductor substrate is formed to cover a surface of the first polysilicon layer;
performing comprehensive dry etching to the first silicon nitride layer on the front surface of the semiconductor substrate, wherein the first silicon nitride layer on the front surface of the semiconductor substrate is disposed on the side surface of the gate structure and dry-etched into a first silicon nitride sidewall, wherein the first silicon nitride layer on the back surface of the semiconductor substrate is not etched;

step 3: growing a second silicon nitride layer with stress for applying the stress memorization technique on the front surface of the semiconductor substrate;

step 4: performing a etching process to remove the silicon nitride layer after stress transfer is completed, wherein the stress transfer comprises steps of:

step 41: performing a first-time wet etching, wherein the first-time wet etching is a single-wafer wet etching for etching the second silicon nitride layer on the front surface of the semiconductor substrate;

step 42: performing a second-time wet etching, wherein the second-time wet etching is a batch wet etching, wherein the second-time wet etching simultaneously removes the second silicon nitride layer left on the front surface of the semiconductor substrate and reduces a thickness of the first silicon nitride layer on the back surface;

step 5: after step 4, performing subsequent back-end-of-line process of the semiconductor device, wherein the back-end-of-line process comprises a plurality of photolithography processes each follows after a cleaning process, wherein the first silicon nitride layer remaining on the back surface of the semiconductor substrate protects the first polysilicon layer on the back surface of the semiconductor substrate from being damaged in the cleaning process so as to have a uniformly flat back surface.

2. The method of applying the stress memorization technique in making the semiconductor device according to claim 1, wherein the semiconductor substrate comprises a silicon substrate.

3. The method of applying the stress memorization technique in making the semiconductor device according to claim 1, wherein the first polysilicon layer is grown by a thermal process in a furnace.

4. The method of applying the stress memorization technique in making the semiconductor device according to claim 1, wherein in step 2, the sidewalls comprise double sidewalls;

after the first sidewall is made, performing light doping implantation to form a lightly doped drain region on the two sides of the corresponding gate structure of the semiconductor device;

forming a second sidewall, wherein the second sidewall comprises a first silicon oxide sidewall and the first silicon nitride sidewall; wherein the first silicon oxide sidewall covers a side surface of the first sidewall, and the first silicon nitride sidewall covers a side surface of the first silicon oxide sidewall.

5. The method of applying the stress memorization technique in making the semiconductor device according to claim 4, wherein after the first silicon nitride sidewall is disposed and before the second silicon nitride layer is grown, the method further comprises performing amorphous implantation to enable a surface structure on the two sides of the gate structure of the semiconductor substrate to be amorphized.

6. The method of applying the stress memorization technique in making the semiconductor device according to claim 1, wherein in step 4, the stress transfer is achieved by an annealing process.

7. The method of applying the stress memorization technique in making the semiconductor device according to claim 6, wherein the annealing process comprises a rapid thermal annealing.

8. The method of applying the stress memorization technique in making the semiconductor device according to claim 1, wherein the semiconductor device comprises an NMOS device and a PMOS device, and wherein in step 4, the stress transfer is performed for forming the NMOS device only.

9. The method of applying the stress memorization technique in making the semiconductor device according to claim 8, wherein in step 3, the method further comprises forming a second oxide layer before forming the second silicon nitride layer.

10. The method of applying the stress memorization technique in making the semiconductor device according to claim 1, wherein the method further comprises the following steps before the subsequent back-end-of-line process of step 5:

performing source and drain implantation to form a source region and the drain region of the semiconductor device in a self-aligned manner on the two sides of the gate structure;

forming self-aligned silicide on surfaces of the source region and the drain region; and forming and planarizing a bottom interlayer film.

11. The method of applying the stress memorization technique in making the semiconductor device according to claim 10, wherein after forming the bottom interlayer film, the method further comprises performing a gate structure replacement process, wherein the gate structure replacement process removes and replaces the polysilicon gate with a metal gate.

12. The method of applying the stress memorization technique in making the semiconductor device according to claim 10, wherein the back-end-of-line process comprises:

forming a plurality of interlayer films, a plurality of front metal layers, a contact hole and a via hole, wherein the first of the plurality of front metal layers is in contact with one of the source region, the drain region and the metal gate at the bottom through the contact, wherein the plurality of front metal layers other than the first front metal layer is connected through the via hole; and wherein the patterned structures of the contact hole, the via hole and the plurality of front metal layers are defined through photolithography processes.

13. The method of applying the stress memorization technique in making the semiconductor device according to claim 1, wherein in step 2, the first silicon nitride layer is formed by a thermal process in a furnace.

14. The method of applying the stress memorization technique in making the semiconductor device according to claim 1, wherein in step 3, the second silicon nitride layer is formed by a chemical vapor deposition process.

15. The method of applying the stress memorization technique in making the semiconductor device according to claim 1, wherein a thickness of the first silicon nitride layer is in the range of 200 Å-220 Å; a thickness of the second silicon nitride layer is in a range of 200 Å-280 Å; after the second-time wet etching in step 42 is completed, a thickness of the first silicon nitride layer remaining on the back surface of the semiconductor substrate is in a range of 100 Å-180 Å.

16. The method for making the semiconductor device by adopting the stress memorization technique according to claim 15, wherein etching solution for the first-time wet etching in step 41 is a hot phosphoric acid solution, a temperature is in a range of 140° C.-160° C., and a duration is in a range of 200 s-300 s.

17. The method of applying the stress memorization technique in making the semiconductor device according to claim 15, wherein etching solution for the second-time wet etching in step 42 is a hot phosphoric acid solution, wherein a temperature is in a range of 140° C.-170° C., and a duration is in a range of 60 s-100 s.

18. The method of applying the stress memorization technique in making the semiconductor device according to claim 1, wherein a technology node of the semiconductor device is 28 nm or less.

* * * * *